(12) United States Patent
Zou

(10) Patent No.: US 11,388,525 B2
(45) Date of Patent: Jul. 12, 2022

(54) MEMS MICROPHONE AND A MANUFACTURING METHOD THEREOF

(71) Applicant: GOERTEK, INC., Weifang (CN)

(72) Inventor: Quanbo Zou, Shandong (CN)

(73) Assignee: Weifang Goertek Microelectronics Co., Ltd., Weifang (CN)

(*) Notice: Subject to any disclaimer, the term of this patent is extended or adjusted under 35 U.S.C. 154(b) by 302 days.

(21) Appl. No.: 16/614,984

(22) PCT Filed: May 31, 2017

(86) PCT No.: PCT/CN2017/086615
§ 371 (c)(1),
(2) Date: Nov. 19, 2019

(87) PCT Pub. No.: WO2018/218509
PCT Pub. Date: Dec. 6, 2018

(65) Prior Publication Data
US 2020/0186939 A1   Jun. 11, 2020

(51) Int. Cl.
| H04R 19/04 | (2006.01) |
| B81B 7/00  | (2006.01) |
| B81C 1/00  | (2006.01) |
| H04R 1/04  | (2006.01) |
| H04R 31/00 | (2006.01) |

(52) U.S. Cl.
CPC .......... *H04R 19/04* (2013.01); *B81B 7/0058* (2013.01); *B81B 7/0061* (2013.01); *B81B 7/0064* (2013.01); *B81C 1/00309* (2013.01); *B81C 1/00333* (2013.01); *H04R 1/04* (2013.01); *H04R 31/006* (2013.01); *B81B 2201/0257* (2013.01); *B81C 2201/0194* (2013.01); *H04R 2201/003* (2013.01)

(58) Field of Classification Search
CPC ........ H04R 19/04; H04R 1/04; H04R 31/006; H04R 2201/003; H04R 31/00; H04R 19/00; H04R 1/08; B81B 7/0058; B81B 7/0061; B81B 7/0064; B81B 2201/0257; B81C 1/00309; B81C 1/00333; B81C 2201/0194
See application file for complete search history.

(56) References Cited

U.S. PATENT DOCUMENTS

| 6,936,524 B2* | 8/2005 | Zhu ............... H04R 19/005 438/455 |
| 10,291,973 B2* | 5/2019 | Lim ............... B81C 1/00309 |
| 2006/0006483 A1* | 1/2006 | Lee ............... B81B 3/0072 257/415 |
| 2010/0002894 A1* | 1/2010 | Lan ............... H04R 31/00 381/163 |
| 2010/0247857 A1* | 9/2010 | Sanami ............... H04M 1/18 428/138 |
| 2012/0177237 A1* | 7/2012 | Shukla ............... B29C 45/1671 381/87 |

(Continued)

*Primary Examiner* — Oyesola C Ojo
(74) *Attorney, Agent, or Firm* — Baker Botts, LLP

(57) ABSTRACT

A MEMS microphone and a manufacturing method thereof are provided. The MEMS microphone comprises a MEMS microphone chip and a housing with an acoustic port. The MEMS microphone chip is mounted in the housing, and a mesh plug is mounted in the acoustic port and made from a mesh material which has a mesh structure that is suitable for passage of sound.

8 Claims, 3 Drawing Sheets

(56) References Cited

U.S. PATENT DOCUMENTS

| | | | |
|---|---|---|---|
| 2014/0044297 A1* | 2/2014 | Loeppert | H04R 1/086 381/355 |
| 2014/0064542 A1* | 3/2014 | Bright | H04R 1/086 381/359 |
| 2016/0071506 A1* | 3/2016 | Qutub | G10K 11/161 381/354 |
| 2016/0261941 A1* | 9/2016 | Brioschi | H04R 1/086 |
| 2016/0337735 A1* | 11/2016 | Lim | H04R 1/086 |
| 2018/0070158 A1* | 3/2018 | Watson | H04R 17/00 |
| 2018/0115811 A1* | 4/2018 | Zhang | H04R 1/086 |

* cited by examiner

MEMS MICROPHONE AND A MANUFACTURING METHOD THEREOF

CROSS-REFERENCE TO RELATED APPLICATIONS

This application is a National Stage of International Application No. PCT/CN2017/086615 filed on May 31, 2017 which is hereby incorporated by reference in its entirety.

FIELD OF THE INVENTION

The present invention relates to the technical field of a MEMS microphone, and more specifically, to a MEMS microphone and a method for manufacturing a MEMS microphone.

BACKGROUND OF THE INVENTION

A Micro-Electro-Mechanical System, or MEMS, is a technology that in its most general form can be defined as miniaturized mechanical and electro-mechanical elements (i.e., devices and structures) that are made using the techniques of micro-fabrication. Generally, a MEMS element is made by the MEMS technology and then is encapsulated into a MEMS device. The MEMS device can further be assembled into an electronics apparatus such as a mobile phone, a pad, a laptop, sensor and so on. An example of a MEMS device may include a MEMS microphone.

Generally, a MEMS microphone includes a MEMS microphone chip, an ASIC chip and a housing. The MEMS microphone chip is used to sense a sound pressure and transform it into an electrical signal. The ASIC chip is used to process the electrical signal. The MEMS microphone chip and the ASIC chip are enclosed in the housing. Generally, the housing has an acoustic port to let the sound pressure come into the MEMS microphone chip and interact with its diaphragm.

The housing can include a substrate and a lid. The acoustic port may be placed in either of the substrate and the lid.

Because the acoustic port is open and communicates with outside environment, the MEMS microphone suffers from external interferences including strong air flow impacts, particles, lights, Radio Frequency (RF)/Electromagnetic (EM) etc. It's also hard for a MEMS microphone to have waterproofing itself.

In the prior art, attempts have been made to address at least one of the above issues. For example, a physical mesh filter may be added.

In a prior art solution, a mesh filter is added at a MEMD die level. This may degrade the performance thereof, or complicate the manufacturing process, which may lead to yield, cost and reliability concerns.

In another prior art solution, a mesh filter is added at a PCB level. In the solution, a fine filter cannot be provided due to process capability, and thus it has little immunity to lights, Radio Frequency (RF)/Electromagnetic (EM). Furthermore, it is hard to it to have waterproofing.

In still another prior art solution, a mesh filter is added at a package level or is added externally to a MEME microphone. This may increase the package size. Its application may be limited to top-ported microphones.

U.S. Pat. No. 9,438,972 B2 discloses a Silicon based MEMS microphone, a system and a package with the same, which is hereby incorporated herein by reference.

CN patent publication No. 203225885 U discloses a MEMS microphone, which is hereby incorporated herein by reference.

U.S. Pat. No. 8,447,057 B2 discloses packages and methods for packaging MEMS microphone devices, which is hereby incorporated herein by reference.

Therefore, there is a demand in the art that a new solution for a MEMS microphone shall be proposed to address at least one of the problems in the prior art.

SUMMARY OF THE INVENTION

One object of this invention is to provide a new technical solution for a MEMS microphone.

According to a first aspect of the present invention, there is provided a MEMS microphone, comprising: a MEMS microphone chip; and a housing, which has an acoustic port, wherein the MEMS microphone chip is mounted in the housing, and a mesh plug is mounted in the acoustic port, and wherein the mesh plug is made from a mesh material which has a mesh structure that is suitable for passing sound pressure to the MEMS microphone chip.

Alternatively or optionally, the MEMS microphone further comprises an ASIC chip, wherein the housing includes a package substrate and a lid, the MEMS microphone chip and the ASIC chip are mounted on the package substrate, and the acoustic port is in the package substrate.

Alternatively or optionally, the acoustic port has a tapper-shape.

Alternatively or optionally, the mesh plug is mounted in the acoustic port from inside of the housing.

Alternatively or optionally, the mesh plug has a step structure so that one part of the mesh plug is inside the acoustic port and another part of the mesh plug is outside the acoustic port.

Alternatively or optionally, the mesh plug is adhered to a side wall of the acoustic port.

Alternatively or optionally, the mesh plug is made of at least one of porous structures, nano-structures, fabric mesh and woven mesh.

Alternatively or optionally, the mesh material of the mesh plug includes at least one of polymer, foam plastic, silicon, silicide, ceramic, metal, alloy, paper, wood and glass.

According to a second aspect of the present invention, there is provided a method for manufacturing a MEMS microphone, comprising: mounting a mesh layer on a carrier substrate; machining the mesh layer into a mesh plug; forming an acoustic port on a housing of the MEMS microphone; dispensing adhesive into the acoustic port; assembling the mesh plug into the acoustic port; releasing the carrier substrate; and mounting a MEMS microphone chip and an ASIC chip in the housing.

Alternatively or optionally, the mesh plug is machined into a step structure so that the mesh plug is assembled into the acoustic port with one part inside the acoustic port and another part outside the acoustic port.

Alternatively or optionally, said another part outside the acoustic port is removed during releasing the carrier substrate.

According to an embodiment, it can provide a new solution of providing a filter to a MEMS microphone.

Further features of the present invention and advantages thereof will become apparent from the following detailed description of exemplary embodiments according to the present invention will reference to the attached drawings.

BRIEF DESCRIPTION OF THE DRAWINGS

The accompanying drawings, which are incorporated in and constitute a part of the specification, illustrate embodi

DETAILED DESCRIPTION OF THE EMBODIMENTS

Figure 1:
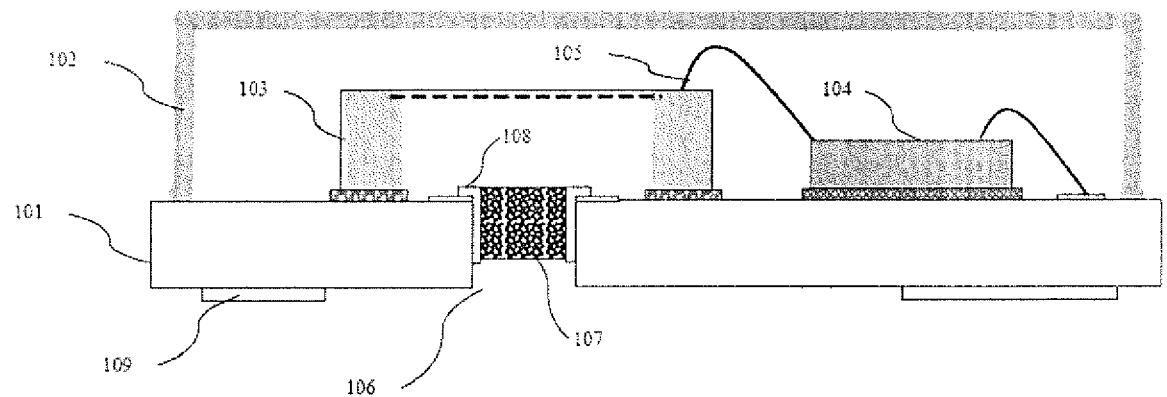
- FIG. 1 shows a schematic diagram of a MEMS microphone according to an embodiment.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Examples and embodiments will be described with reference to the drawings.

The inventor of this invention has found that a lot of materials in the prior art have a mesh structure. They are suitable for passing sound pressure. These materials may have porous structures, nano-structures, fabric mesh and woven mesh. They can be polymer, foam plastic, silicon, silicide, ceramic, metal, alloy, paper, wood or glass.

In the prior art, technicians always think of forming a filter member on an acoustic port of a microphone. Examples may include the solutions of the prior patent documents cited in the background part above. Here, the inventor proposes to use the characteristics of filtering material, which has a mesh structure. This is a technical direction completely different from those in the prior art.

FIG. 1 shows a schematic diagram of a MEMS microphone according to an embodiment.

As shown in FIG. 1, the MEMS microphone comprises a MEMS microphone chip 103 and a housing. The housing may include a package substrate 101 and a lid 102, which form a housing cavity. The housing has an acoustic port 106. Although it is shown in FIG. 1 that the acoustic port 106 is in the package substrate 101, it can also be place in the lid 102.

The MEMS microphone chip 103 is mounted in the housing. A mesh plug 107 is mounted in the acoustic port 106. That is, the mesh plug is filled in acoustic port and thus the size of the M EMS microphone with filtering function will not increase. The mesh plug 107 is made from a mesh material which has a mesh structure that is suitable for passing sound pressure to the MEMS microphone chip. That is, the mesh plug is an acoustic mesh plug.

As described above, the mesh plug 107 may be made of at least one of porous structures, nano-structures, fabric mesh and woven mesh. For example, the mesh material of the mesh plug 107 may include at least one of polymer, foam plastic, silicon, silicide, ceramic, metal, alloy, paper, wood and glass. The mesh material can be rigid, or flexible, or soft/deformable. Under the teaching here, a person skilled in the art can conceive other materials which is suitable be used as the mesh material for the mesh plug 107.

As shown in FIG. 1, the MEMS microphone may further comprise an ASIC chip 104. The MEMS microphone chip 103 and the ASIC chip 104 are mounted on the package substrate 101. For example, the MEMS microphone chip 103 and the ASIC chip 104 are connected via a wire 105.

In an example, the acoustic port 106 may have a tapper-shape so that it may be easier to insert the mesh plug inside.

In another example, the mesh plug 107 may be mounted in the acoustic port 106 from inside of the housing. In this manner, the overall size of the MEMS microphone may remain the same or be reduced.

Figure 8:
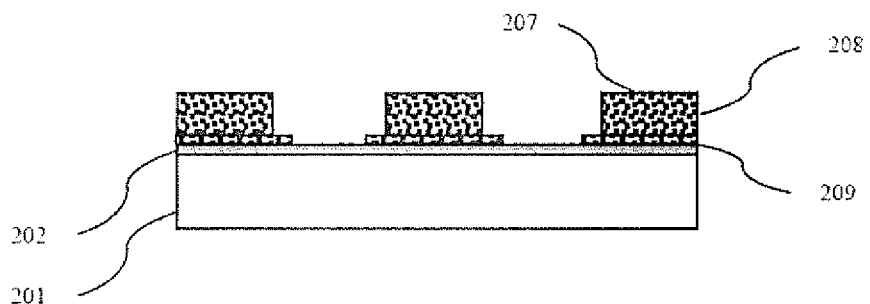
FIG. 8 shows an alternative embodiment of a mesh plug.

As shown in FIG. 8, the mesh plug 207 may have a step structure. For example, it has a two step structure, which includes a first step 208 and a second step 209. The first step 208 will be placed inside the acoustic port 106 and the second step 209 will be left outside the acoustic port. That is, one part of the mesh plug 207 is inside the acoustic port 106 and another part of the mesh plug 207 is outside acoustic port 106. In this manner, the contact area of the mesh plug with outside environment will be increased and thus a sound pressure communication effect may be improved.

The mesh plug 107 can be adhered to a side wall of the acoustic port 106. For example, an adhesive 108 is applied between the side wall and the mesh plug 107. In this situation, it may be benefit if the mesh plug 207 has a step structure, because it will prevent the adhesive to cover the top of the mesh plug. If the adhesive covers the top of the mesh plug, it will block a sound pressure to pass through the mesh plug and thus the performance may be lowered.

The adhesive 108 can be electrically conductive or non-conductive. Examples thereof may include, but not limited to, silver paste, solder paste, glue, epoxy, etc.

In an embodiment, the mesh plug will provide a filter for a MEMS microphone with highly improved reliability.

It provides a possibility to use different mesh materials as demand, which may has immunity to air blow impacts (such as impacts from a strong air blow), particles, lights, RF or EM. A mesh plug made from a waterproofing material can also be used so that a waterproofing function may be provided to a MEMS microphone per se.

The embodiment using a mesh plug will provide benefits with little or no performance degradation.

Because the mesh plug is mounted in the acoustic port, the package size of the MEMS microphone will remain the same or be reduced. This will be advantageous for minimizing the site of an electronic device.

FIGS. 2-7 show processes of manufacturing a MEMS microphone according to (other embodiments.

Figure 2:
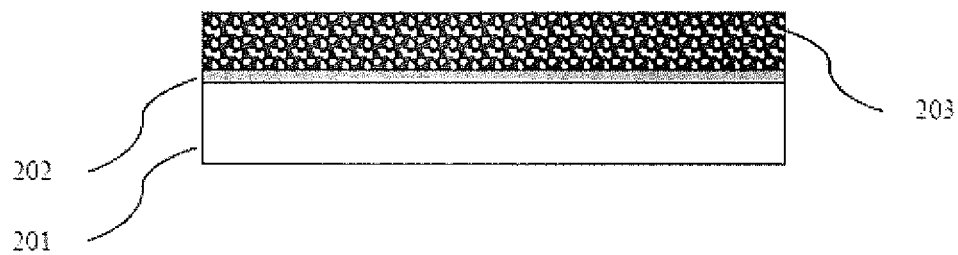
FIGS. 2-7 show processes of manufacturing a MEMS microphone according to other embodiments.

As shown in FIG. 2, a mesh layer 203 is mounted on a carrier substrate 201, for example, via a temporary adhesive layer 202. For example, the temporary adhesive 202 is UV glue, and the carrier substrate 201 is a PET or glass substrate.

Figure 3:
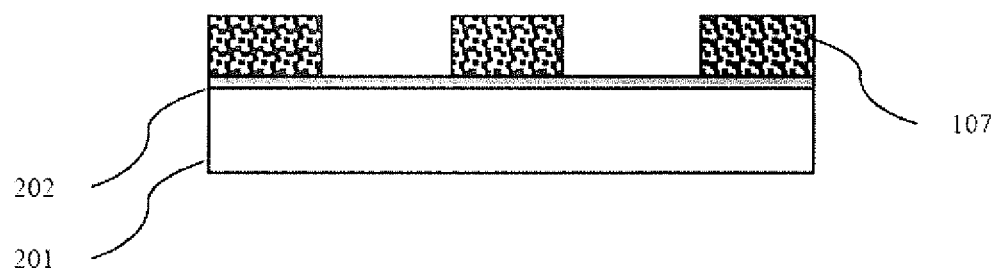

As shown in FIG. 3, the mesh layer 203 is machined into mesh plugs 107. The machining process may include milling, edge grinding, etching, laser trimming, EDM (electrical discharge machining), cutting, etc.

The mesh layer 203 may be machined through. Alternatively, the thickness of the mesh layer 203 can be machined partially to form a step structure. FIG. 8 shows an alternative form of the mesh plug 207, which is machined into a step structure so that the mesh plug will be assembled into the acoustic port with one part inside the acoustic port and another part outside the acoustic port. As described above, the step structure may be benefit in some aspects.

Figure 4:
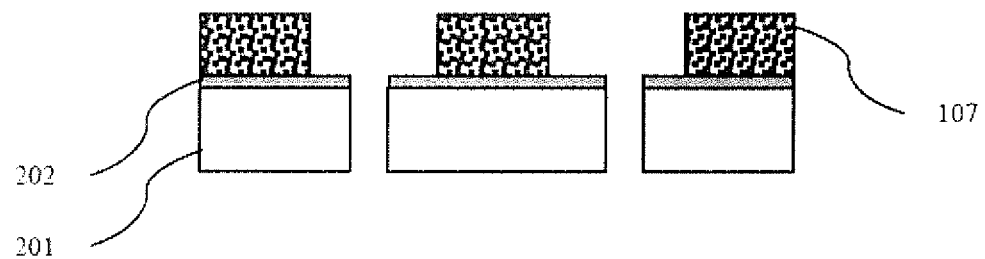

As shown in FIG. 4, the carrier substrate 201 is cut into separate dices to form individual mesh plugs 107. The cutting process may include mechanical dicing, laser cutting, etc.

Figure 5:
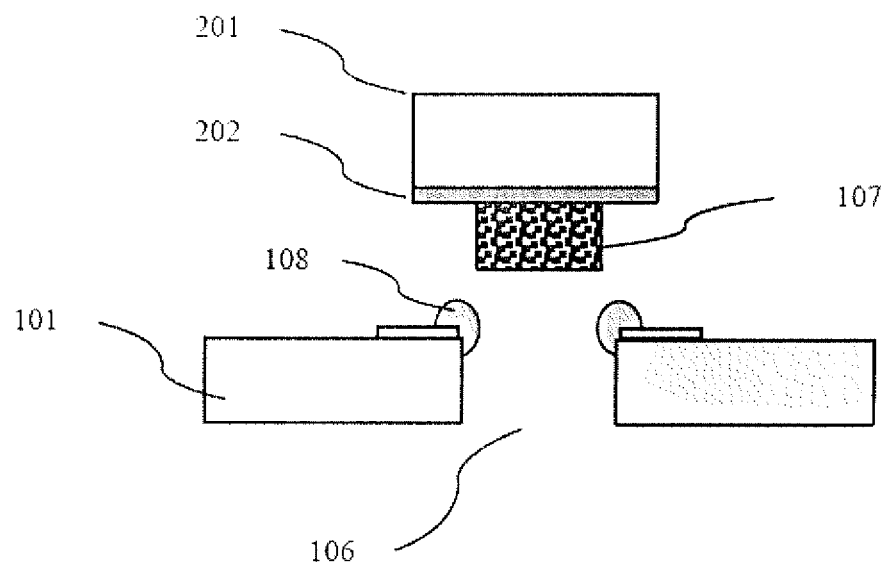

As shown in FIG. 5, an acoustic port 106 is formed on a housing of the MEMS microphone. In FIG. 5, the acoustic port 106 is formed on a package substrate 101.

Also in FIG. 5, adhesive 108 is dispensed into the acoustic port 106. The mesh plug 107 is ready to be placed into the acoustic port 106.

Figure 6:
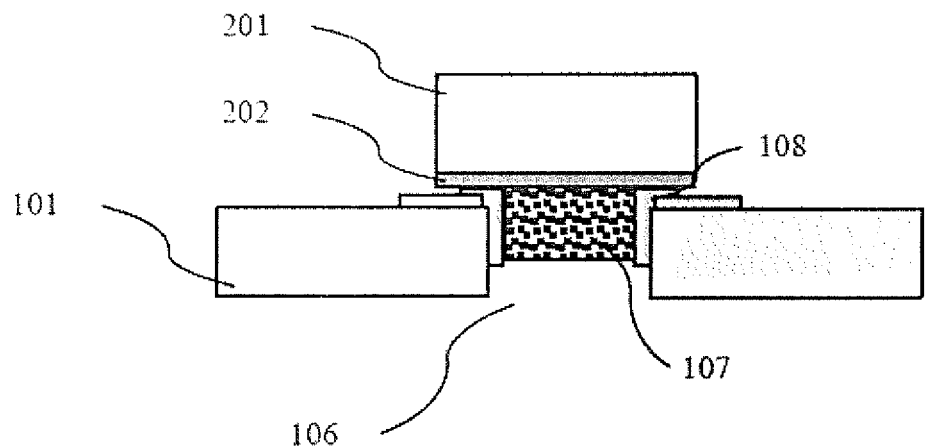

As shown in FIG. 6, the mesh plug 107 is assembled into the acoustic port 106. The adhesive 108 may be cured.

Figure 7:
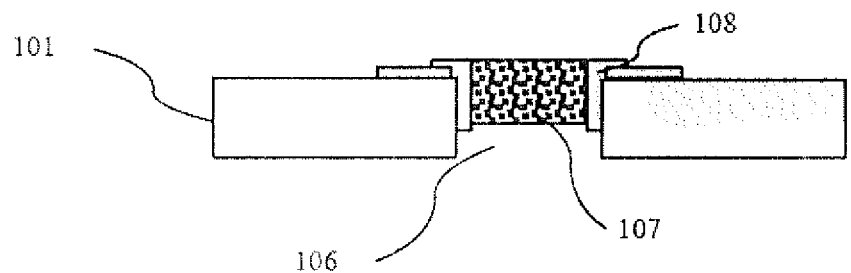

As shown in FIG. 7, the carrier substrate 201 is released. The carrier substrate 201 is lifted-off. The temporary adhesive 202 is also released. The releasing may be performed by light/laser exposure or thermal treatment.

As shown in FIG. 8, the mesh plug 207 may have a step structure, which includes, for example, two steps of a first step 208 and a second step 209. The first step 208 will be placed inside the acoustic port 106 and the second step 209 will be left outside the acoustic port. That is, one part of the mesh plug 207 is inside the acoustic port 106 and another part of the mesh plug 207 is outside the acoustic port 106. Said another part (the second step 209) outside the acoustic port 106 may be removed during releasing the carrier substrate 202. Alternatively, it can be retained.

A MEMS microphone chip 103 and an ASIC chip 104 may also be mounted in the housing, for example, as what is shown in FIG. 1. They can be mounted before or after the placement of the mesh plug as demanded. This is not what is claimed in this application, and thus the sequence is not a limitation to this invention.

The MEMS microphone will be ready for use. For example, it can be mounted in an electronic device, such as a mobile phone, a pad, a laptop and so on.

Although some specific embodiments of the present invention have been demonstrated in detail with examples, it should be understood by a person skilled in the art that the above examples are only intended to be illustrative but not to limit the scope of the present invention.

What is claimed is:

1. A MEMS microphone, comprising:
   a MEMS microphone chip;
   a housing, which has an acoustic port, and
   a mesh plug,
   wherein the MEMS microphone chip is mounted in the housing, and the mesh plug is mounted in the acoustic port,
   wherein the mesh plug is made from a mesh material which has a mesh structure adapted for passing sound pressure to the MEMS microphone chip, and
   wherein the mesh plug has a step structure so that a first part of the mesh plug is inside the acoustic port and a second part of the mesh plug is outside the acoustic port.

2. The MEMS microphone according to claim 1, further comprising yin ASIC chip, wherein the housing includes a package substrate and a lid, the MEMS microphone chip and the ASIC chip are mounted on the package substrate, avid the acoustic port is in the package substrate.

3. The MEMS microphone according to claim 1, wherein the acoustic port has a tapper-shape.

4. The MEMS microphone according to claim 1 wherein the mesh plug is adhered to a side wall of the acoustic port.

5. The MEMS microphone according to claim 1, wherein the mesh plug is made of at least one of porous structures, nano-structures, fabric mesh and woven mesh.

6. The MEMS microphone according to claim 1, wherein the mesh material of the mesh plug includes at least one of a polymer, foam plastic, silicon, silicide, ceramic, metal, alloy, paper, wood and glass.

7. A method for manufacturing a MEMS microphone; comprising:
   mounting a mesh layer on a carrier substrate;
   machining the mesh layer into a mesh plug;
   forming an acoustic port on a housing of the MEMS microphone;
   dispensing adhesive into the acoustic port;
   assembling the mesh plug into the acoustic port;
   releasing the carrier substrate; and
   mounting a MEMS microphone chip and an ASIC chip in the housing,
   wherein the mesh plug is machined into a step structure so that the mesh plug is assembled into the acoustic port with a first part inside the acoustic port and a second part outside the acoustic port.

8. The method according to claim 7, wherein said second part outside the acoustic port is removed during releasing the carrier substrate.

* * * * *